(12) United States Patent
Song et al.

(10) Patent No.: US 11,367,754 B2
(45) Date of Patent: Jun. 21, 2022

(54) OLED DISPLAY SUBSTRATE INCLUDING PIXEL DRIVE CIRCUIT OF FIRST SUB-PIXEL UNIT OVERLAPPING ANOTHER SUB-PIXEL UNIT

(71) Applicant: BOE TECHNOLOGY GROUP CO., LTD., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 107 days.

(21) Appl. No.: 16/769,353

(22) PCT Filed: Sep. 4, 2019

(86) PCT No.: PCT/CN2019/104356
§ 371 (c)(1),
(2) Date: Jun. 3, 2020

(87) PCT Pub. No.: WO2020/155626
PCT Pub. Date: Aug. 6, 2020

(65) Prior Publication Data
US 2021/0225957 A1 Jul. 22, 2021

(30) Foreign Application Priority Data
Jan. 29, 2019 (CN) .......................... 201910085413.7

(51) Int. Cl.
*H01L 27/32* (2006.01)
*H01L 51/56* (2006.01)
*H01L 51/52* (2006.01)

(52) U.S. Cl.
CPC ...... *H01L 27/3218* (2013.01); *H01L 27/3213* (2013.01); *H01L 27/3276* (2013.01);
(Continued)

(58) Field of Classification Search
CPC ............ H01L 27/3218; H01L 27/3213; H01L 27/3276; H01L 51/56
(Continued)

(56) References Cited

U.S. PATENT DOCUMENTS 8,976,438 B2 3/2015 Arai et al.
9,111,890 B2 8/2015 Chung et al.
(Continued)

FOREIGN PATENT DOCUMENTS

CN 102842266 A 12/2012
CN 203325906 U 12/2013
(Continued)

OTHER PUBLICATIONS

International Search Report dated Nov. 28, 2019, issued in counterpart application No. PCT/CN2019/104356 (13 pages).
(Continued)

*Primary Examiner* — Matthew E. Gordon
(74) *Attorney, Agent, or Firm* — WHDA, LLP

(57) ABSTRACT

A display substrate (10) includes a first base substrate (101) including a plurality of pixel units (101a) arranged in an array, at least one of the plurality of pixel units (101a) including at least two sub-pixel units and a transparent area (TA). The at least two sub-pixel units includes a first sub-pixel unit that is arranged between transparent areas (TA) of adjacent pixel units (101a) in a first direction. An orthographic projection of a pixel drive circuit (105) electrically coupled to the first sub-electrode (102a) corresponding to the first sub-pixel unit on the first base substrate (101) partially overlaps with an orthographic projection of a first sub-electrode (102a) positionally corresponding to another sub-pixel unit on the first base substrate (101).

16 Claims, 9 Drawing Sheets

(52) U.S. Cl.
CPC ............ *H01L 51/56* (2013.01); *H01L 27/322* (2013.01); *H01L 51/5284* (2013.01)

(58) Field of Classification Search
USPC .......................................................... 257/79
See application file for complete search history.

(56) References Cited

U.S. PATENT DOCUMENTS

| | | | |
|---|---|---|---|
| 9,159,295 B2 | 10/2015 | Jung et al. | |
| 9,640,599 B2 | 5/2017 | Jinta | |
| 9,793,508 B2 | 10/2017 | Wang | |
| 2001/0055828 A1* | 12/2001 | Kaneko | G09G 3/3233 438/34 |
| 2009/0114926 A1 | 5/2009 | Yamazaki | |
| 2012/0327498 A1* | 12/2012 | Arai | H01L 27/3232 359/267 |
| 2013/0187131 A1* | 7/2013 | Chung | H01L 27/3276 257/40 |
| 2017/0084679 A1* | 3/2017 | Jinta | H01L 27/1259 |
| 2018/0069056 A1* | 3/2018 | Sato | H01L 51/5012 |
| 2019/0027547 A1 | 1/2019 | Kim et al. | |

FOREIGN PATENT DOCUMENTS

| | | |
|---|---|---|
| CN | 103972270 A | 8/2014 |
| CN | 103985729 A | 8/2014 |
| CN | 105518771 A | 4/2016 |
| CN | 107562270 A | 1/2018 |
| CN | 108281464 A | 7/2018 |
| CN | 108415188 A | 8/2018 |
| CN | 109817672 A | 5/2019 |
| KR | 20150050318 A | 5/2015 |

OTHER PUBLICATIONS

Office Action dated Jul. 17, 2020, issued in counterpart CN application No. 201910085413.7, with English translation. (17 pages).

* cited by examiner

OLED DISPLAY SUBSTRATE INCLUDING PIXEL DRIVE CIRCUIT OF FIRST SUB-PIXEL UNIT OVERLAPPING ANOTHER SUB-PIXEL UNIT

CROSS-REFERENCE TO RELATED APPLICATIONS

This application claims benefit of the filing date of Chinese Patent Application No. 201910085413.7 filed on Jan. 29, 2019, the disclosure of which is hereby incorporated in its entirety by reference.

TECHNICAL FIELD

The present disclosure generally relates to display technologies, and in particular, to an organic light-emitting diode (OLED) display substrate and a method of fabricating the display substrate, a display panel containing the display substrate, and a display device containing the display panel.

BACKGROUND

Display technologies are becoming increasingly diverse, and display devices embodying new display technologies are regularly being introduced into the market and people's daily lives. Currently, the display technologies mainly include two main categories: organic light-emitting diode (OLED) technology and liquid crystal display (LCD) technology. The field of LCD technology is established and mature, and recent developments trend toward providing ultra-high resolution. The field of OLED technology is still maturing. OLED technology is commonly used in mobile phones, tablets, and other display devices having small to medium-sized screens. Of course, OLED technology is also used in large-screen televisions.

BRIEF SUMMARY

An embodiment of the present disclosure is a display substrate. The display substrate may comprise a first base substrate comprising a plurality of pixel units arranged in an array, at least one of the plurality of pixel units comprising at least two sub-pixel units and a transparent area; a first electrode layer on the first base substrate comprising a plurality of first sub-electrodes, each of the plurality of first sub-electrodes positionally corresponding to one of the at least two sub-pixel units; a pixel define layer on the first electrode layer, the pixel define layer comprising a plurality of openings, each of the plurality of openings positionally corresponding to a light-emitting region of one of the at least two sub-pixel units and to the transparent area; and a plurality of pixel drive circuits, each of the plurality of pixel drive circuits being electrically coupled to a corresponding one of the plurality of first sub-electrodes. The at least two sub-pixel units may comprise a first sub-pixel unit, the first sub-pixel unit being arranged between transparent areas of adjacent pixel units in a first direction. An orthographic projection of a pixel drive circuit electrically coupled to the first sub-electrode corresponding to the first sub-pixel unit on the first base substrate may partially overlap with an orthographic projection of a first sub-electrode positionally corresponding to another sub-pixel unit on the first base substrate.

In at least some embodiments, the orthographic projection on the first base substrate of the pixel drive circuit electrically coupled to the first sub-electrode corresponding to the first sub-pixel unit may partially overlap with an orthographic projection on the first base substrate of a first sub-electrode positionally corresponding to a sub-pixel unit nearest to the first sub-pixel unit.

In at least some embodiments, the display substrate may further comprise a plurality of signal wires extending in a second direction. In at least some embodiments, the second direction may intersect with the first direction.

In at least some embodiments, an orthographic projection of a light-emitting region of the first sub-pixel unit on the first base substrate may be within an orthographic projection of the plurality of signal wires on the first base substrate.

In at least some embodiments, the first sub-pixel unit may have a rectangular shape, and a ratio of a length of the first sub-pixel unit to a width of the first sub-pixel unit may be from 9:1 to 5:1.

In at least some embodiments, the first sub-pixel unit may be configured to emit a white light.

In at least some embodiments, the display substrate may further comprise a light-emitting layer on the first electrode layer, and a second electrode layer on the light-emitting layer.

In at least some embodiments, the display substrate may further comprise a first auxiliary electrode layer on the second electrode layer. In at least some embodiments, the first auxiliary electrode layer may be electrically coupled to the second electrode layer.

In at least some embodiments, the display substrate may further comprise a first black matrix on the second electrode layer. In at least some embodiments, an orthographic projection of the first black matrix on the first base substrate may be within an orthographic projection of the pixel define layer.

In at least some embodiments, the display substrate may further comprise a first color filter layer on a side of the first black matrix opposite from the first base substrate. In at least some embodiments, the first color filter layer may be arranged to positionally correspond to any one of the at least two sub-pixel units other than the first sub-pixel unit and to the transparent area.

In at least some embodiments, each pixel drive circuit may comprise a capacitor, a first thin film transistor, and a second thin film transistor. In at least some embodiments, the capacitor may comprise a first capacitor layer and a second capacitor layer. In at least some embodiments, the first thin film transistor may comprise a first active layer, a first gate electrode, a first source electrode, and a first drain electrode. In at least some embodiments, the second thin film transistor may comprise a second active layer, a second gate electrode, a second source electrode, and a second drain electrode. In at least some embodiments, the first capacitor layer may be electrically coupled to the first gate electrode, and one of the second source electrode and the second drain electrode. In at least some embodiments, the second capacitor layer may be electrically coupled to one of the first source electrode and the first drain electrode, and one of the plurality of electrode corresponding to the pixel drive circuit.

In at least some embodiments, the second capacitor layer may be provided in a same layer as the first active layer.

In at least some embodiments, the first capacitor layer may be provided in a same layer as the first electrode layer.

In at least some embodiments, the first electrode layer may comprise a reflective electrode layer and a transparent electrode layer arranged in this order in a direction away from the first base substrate.

In at least some embodiments, the first capacitor layer may be provided in a same layer as the transparent electrode layer.

In at least some embodiments, the first capacitor layer may be provided in a same layer as one of the first source electrode and the first drain electrode.

Another embodiment of the present disclosure is a display device. The display device may comprise a display substrate as described above, and an opposite substrate comprising a second base substrate and a second black matrix on the second base substrate.

In at least some embodiments, an orthographic projection of the second black matrix on the first base substrate may be within an orthographic projection of the pixel define layer on the first base substrate.

In at least some embodiments, the display device may further comprise a second color filter layer on a side of the second black matrix opposite from the second base substrate. In at least some embodiments, the second color filter layer may be arranged to positionally correspond to any one of the at least two sub-pixel units other than the first sub-pixel unit and to the transparent area.

In at least some embodiments, the display device may further comprise a second auxiliary electrode layer on a side of the second color filter layer opposite from the second base substrate. In at least some embodiments, the second auxiliary electrode layer may be configured to be electrically coupled to the second electrode layer. In at least some embodiments, the second auxiliary electrode layer may be composed of a metal material. In at least some embodiments, the second electrode layer may be composed of a transparent material.

Another embodiment of the present disclosure is a method of fabricating a display substrate. The method may comprise forming a first base substrate comprising a plurality of pixel units arranged in an array, at least one of the plurality of pixel units comprising at least two sub-pixel units and a transparent area; forming a first electrode layer on the first base substrate, the first electrode layer comprising a plurality of first sub-electrodes, each of the plurality of first sub-electrodes positionally corresponding to one of the at least two sub-pixel units; forming a pixel define layer on the first electrode layer, the pixel define layer comprising a plurality of openings, each of the plurality of openings positionally corresponding to a light-emitting region of one of the at least two sub-pixel units and to the transparent area; and forming a plurality of pixel drive circuits, each of the plurality of pixel drive circuits being electrically coupled to a corresponding one of the plurality of first sub-electrodes.

In at least some embodiments, the at least two sub-pixels may comprise a first sub-pixel unit, the first sub-pixel unit being arranged between transparent areas of adjacent pixel units in a first direction.

In at least some embodiments, an orthographic projection of a pixel drive circuit electrically coupled to the first sub-electrode corresponding to the first sub-pixel unit on the first base substrate may partially overlap with an orthographic projection of a first sub-electrode positionally corresponding to another one of the at least two sub-pixel units on the first base substrate.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
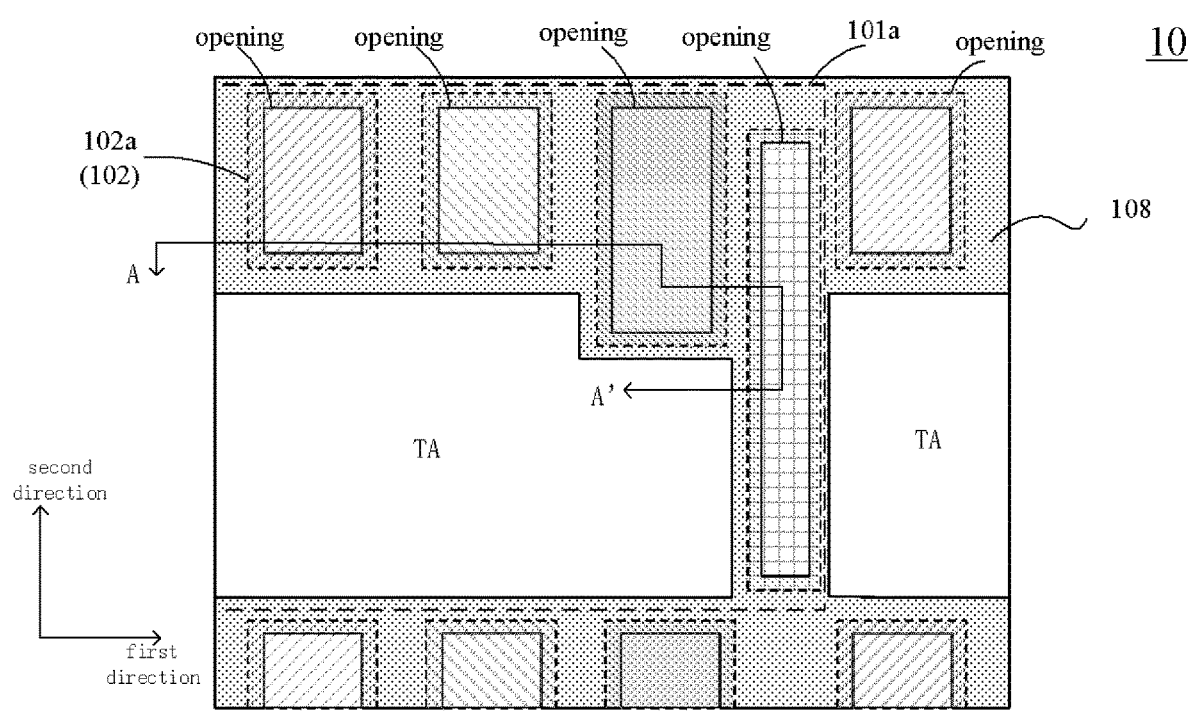
FIG. 1 shows a schematic diagram of a top view of an OLED display substrate according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Currently, the display technologies mainly include two main categories: organic light-emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

Further, continuous revamping and advancements in display technologies have produced a new form of display device: a transparent display device. When a transparent display device is not in use, the user can see through the display device. This transparency is the commercial appeal of the transparent display devices that makes them the focus of recent developments in display technologies.

The display panels on transparent display devices commonly incorporate OLED technology. The transparent display panels generally include a plurality of pixel units. Each pixel unit may in turn include a transparent area and at least two color sub-pixel units. The at least two color sub-pixel units may include, for example, a red sub-pixel unit, a green sub-pixel unit, and a blue sub-pixel unit.

A transparent display panel commonly includes signal wires for transmitting display drive signals. To prevent the signal wires from reflecting ambient light incident on the transparent display panel, the signal wires are often covered with a black matrix. The black matrix, however, tends to occupy a portion of the pixel unit, and as a result, may reduce the transparency of the transparent display panel.

The present disclosure provides an OLED display substrate, in which a sub-pixel unit may be provided between transparent areas of the sub-pixel units of adjacent pixel units. This location may coincide with the signal wires, but the sub-pixel unit is not covered with a black matrix. Since light is allowed to emit through the sub-pixel unit, the OLED display substrate according to the present disclosure thus makes it possible to increase the brightness of a display panel incorporating the display substrate.

FIG. 1 shows a schematic diagram of a top view of an OLED display substrate according to an embodiment of the present disclosure.

As shown in FIG. 1, the OLED display substrate 10 comprises a first base substrate 101. A first electrode layer 102 is provided on the first base substrate 101, and a pixel define layer 108 is provided on the first electrode layer 102. Because FIG. 1 shows a top view of the OLED display substrate, the component layers of the OLED display substrate 10 are not shown in FIG. 1. (corresponding to areas designated "opening" in FIG. 1)

The first base substrate 101 comprises a plurality of pixel units 101*a* arranged in an array. At least one of the plurality of pixel units 101*a* comprises a transparent area TA and at least two sub-pixel units (corresponding to areas designated 102*a* in FIG. 1). The at least two sub-pixel units comprise at least one color sub-pixel unit and a white sub-pixel unit. In some embodiments, at least one of the plurality of pixel units 101*a* comprises more than two sub-pixel units, and one of the sub-pixel units is a white sub-pixel unit and the other sub-pixels are color sub-pixel units.

A first electrode layer 102 is provided on the first base substrate, and comprises a plurality of first sub-electrodes 102*a*. The first sub-electrodes 102*a* are block electrodes. Each of the plurality of first sub-electrodes 102*a* positionally corresponds to one of the at least two sub-pixel units.

A pixel define layer 108 is provided on the first electrode layer 102, and comprises a plurality of openings. Each of the plurality of openings positionally corresponds to a light-emitting region of one of the at least two sub-pixel units and to the transparent area.

Figure 2:
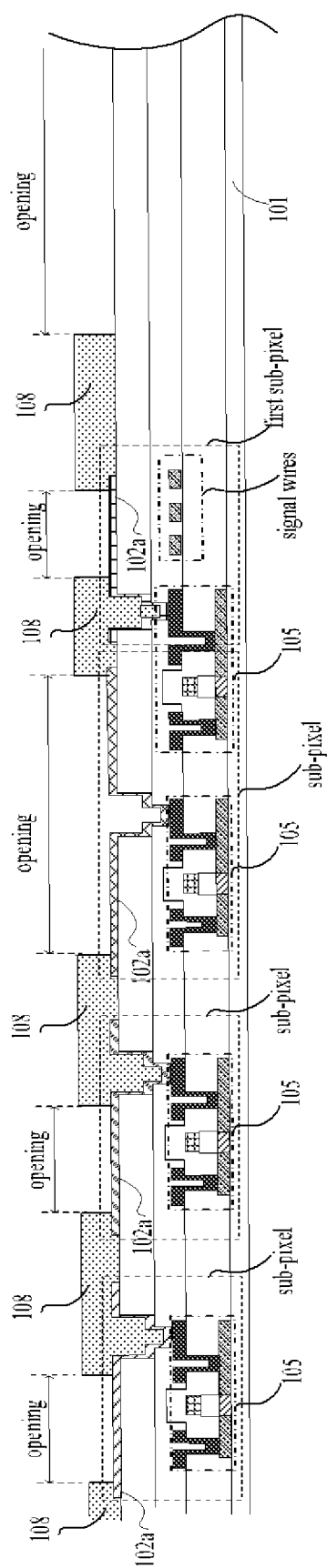
FIG. 2 shows a schematic diagram of a cross-sectional view of the OLED display substrate illustrated in FIG. 1 along the A-A' line.

FIG. 2 shows a schematic diagram of a top view of an OLED display substrate according to another embodiment of the present disclosure.

The first base substrate 101 comprises a plurality of pixel units 101*a* arranged in an array. At least one of the plurality of pixel units 101*a* comprising at least two sub-pixel units and a transparent area TA. The at least two sub-pixel units comprise a first sub-pixel unit, the first sub-pixel unit being arranged between the transparent areas TA of adjacent pixel units in a first direction. In some embodiments, the sub-pixel units are configured to have a square shape or a rectangular shape. A width of each of the sub-pixel units may be in the range of from about 70 μm to about 200 μm, and a length of the each of the sub-pixel units may be in the range of from about 200 μm to about 630 μm. In some embodiments, the ratio of the length of a sub-pixel unit to the width of the sub-pixel unit is in the range of from 1:1 to 9:1. More preferably, the length to width ratio of the sub-pixel unit other than the first sub-pixel unit is in the range of from 1.2:1 to 1:1. It is further understood that in some embodiments, the at least two sub-pixel units have different dimensions from each other. In some embodiments, the pixel unit comprises more than two sub-pixel units, and at least a portion of the plurality of sub-pixel units have the same dimensions.

In some embodiments, the first sub-pixel unit is configured to have a rectangular shape. For example, the width of the first sub-pixel unit is from about 70 μm to about 200 μm, and the length of the first sub-pixel unit is from about 200 μm to about 630 μm. In some embodiments, the first sub-pixel unit is configured to have a rectangular shape oriented so that the width direction of the rectangle is in the first direction, and the length direction of the rectangle is in the second direction, for example as shown in FIG. 1. In some embodiments, the ratio of the length of the first sub-pixel unit to the width of the first sub-pixel unit is in the range of from 9:1 to 5:1. More preferably, the length to width ratio of the first sub-pixel unit is 6:1. In some embodiments, the width of the first sub-pixel unit is about 70 μm, and the length of the first sub-pixel unit is about 420 μm.

In some embodiments, the width and length of the sub-pixel units other than the first sub-pixel unit may be in the range of from about 170 μm to about 200 μm. In some embodiments, at least one of the sub-pixel units has a rectangular shape, and is dimensioned to have a width of about 170 μm and a length of about 200 μm. In some embodiments, at least one of the sub-pixel units has a square shape, and is dimensioned to have a width and a length of about 200 μm.

In some embodiments, the first sub-pixel unit is a white sub-pixel unit, that is, a sub-pixel unit configured to emit white light. A sub-pixel unit may be configured as a white sub-pixel unit according to any suitable means known to a person of ordinary skill in the art. In some embodiments, the display substrate may be a white OLED (WOLED) display substrate. In such embodiments, the light-emitting pattern in each sub-pixel unit is composed of the same material, and is configured to emit white light. But, the display substrate further comprises a color filter layer that configures each sub-pixel unit to emit light of the desired color. In other embodiments, the display substrate is a RGBW OLED display substrate, which does not include a color filter layer. In such embodiments, the light-emitting patterns in the sub-pixel units are composed of different materials, and are configured so that the sub-pixel units emit lights of different colors.

In some embodiments, the display substrate may comprise a red sub-pixel unit, a green sub-pixel unit, and a blue sub-pixel unit, and the first sub-pixel unit is the white sub-pixel unit. The red, green, blue, and white sub-pixel units are arranged in this order in the first direction. In some embodiments, the sizes of the red, green, blue, and white sub-pixel units, as measured by their surface areas ($S_{red}$, $S_{green}$, $S_{blue}$, $S_{white}$) satisfy the following relationships: $S_{blue} > S_{red} > S_{white}$; $S_{blue} > S_{green} > S_{white}$. In some embodiments, $S_{red} = S_{green}$.

As shown in FIG. 2, a first electrode layer 102 is provided on the first base substrate, and comprises a plurality of first sub-electrodes 102a. The first sub-electrodes 102a are block electrodes. Each of the plurality of first sub-electrodes 102a positionally corresponds to one of the at least two sub-pixel units.

A pixel define layer 108 is provided on the first electrode layer 102, and comprises a plurality of openings. Each of the plurality of openings positionally corresponds to a light-emitting region of one of the at least two sub-pixel units and to the transparent area.

Figure 3:
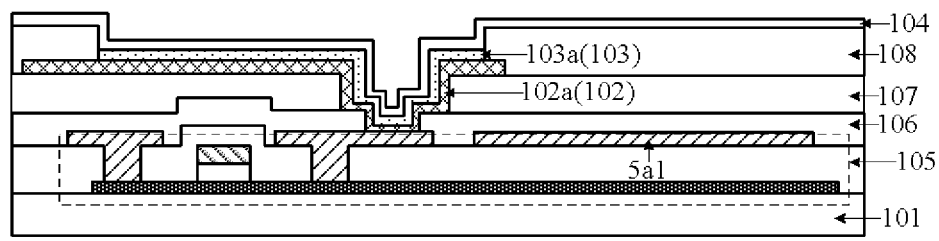
FIG. 3 shows a schematic diagram of a cross-sectional view of an OLED display substrate according to an embodiment of the present disclosure.

The display substrate further comprises a plurality of pixel drive circuits 105. Each of the plurality of pixel drive circuits 105 is electrically coupled to a corresponding one of the plurality of first sub-electrodes 102a. Each of the plurality of pixel drive circuits 105 is configured to supply a voltage to the corresponding first sub-electrode 102a, and drive the first sub-electrode 102a to drive a corresponding light emitting pattern 103a in the light-emitting layer 103 (for example, as shown in FIG. 3) to emit light. The orthographic projection of each pixel drive circuit 105 on the first base substrate 101 at least partially overlaps with the orthographic projection of the corresponding first sub-electrode 102a on the first base substrate 101. In some embodiments, the orthographic projection of each pixel drive circuit 105 on the first base substrate 101 is within the orthographic projection of the corresponding first sub-electrode 102a on the first base substrate 101. The configurations of the pixel drive circuits 105 relative to the first sub-electrodes 102a make it possible to avoid interferences from the pixel drive circuits 105 on the light-emitting functions of the sub-pixel units.

As shown in FIG. 2, the orthographic projection of a pixel drive circuit 105 electrically coupled to the first sub-electrode 102a corresponding to the first sub-pixel unit on the first base substrate 101 partially overlaps with an orthographic projection of a first sub-electrode 102a positionally corresponding to another one of the at least two sub-pixel units on the first base substrate 101. This overlap obviates the need to cover the first sub-pixel unit with a black matrix, so that light may be emitted through the light-emitting region of the first sub-pixel unit. The present disclosure thus increases the total surface area of the light-emitting regions on the display substrate, making it possible to increase the brightness of a transparent display panel.

In some embodiments, at least one of the plurality of pixel units comprises more than two sub-pixel units. For example, in the embodiment illustrated in FIG. 1, the display substrate comprises four sub-pixel units. In such embodiments, the orthographic projection on the first base substrate of the pixel drive circuit 105 electrically coupled to the first sub-electrode 102a corresponding to the first sub-pixel unit partially overlaps with an orthographic projection on the first base substrate of a first sub-electrode 102a positionally corresponding to the sub-pixel unit nearest to the first sub-pixel unit. In some embodiments, the sub-pixel unit nearest to the first sub-pixel unit is a sub-pixel unit in the same pixel unit as the first sub-pixel unit. In other embodiments, the nearest sub-pixel unit is a sub-pixel unit in a pixel unit adjacent to the pixel unit to which the first sub-pixel unit belongs. For example, in the embodiment illustrated in FIG. 1, the first sub-pixel unit is between the transparent areas TA of adjacent pixel units in the "x" direction. The orthographic projection on the first base substrate of the pixel drive circuit electrically coupled to the first sub-electrode may partially overlap with the orthographic projection on the first base substrate of a first sub-electrode positionally corresponding to the sub-pixel unit to the left of the first sub-pixel unit (i.e., in the same pixel unit as the first sub-pixel unit) or to the right of the first sub-pixel unit (i.e., in the adjacent pixel unit).

In some embodiments, the first sub-pixel unit is a white sub-pixel. In such embodiments, the orthographic projection on the first base substrate 101 of the pixel drive circuit 105 electrically coupled to the first sub-electrode 102a corresponding to the white sub-pixel unit partially overlaps with the orthographic projection on the first base substrate 101 of a first sub-electrode 102a positionally corresponding to the sub-pixel unit nearest to the white sub-pixel unit.

Further as shown in FIG. 2, the display substrate comprises a plurality of signal wires extending in a second direction. The second direction is oriented to intersect the first direction. As described above, the first sub-pixel is arranged between the transparent areas TA of adjacent pixel units in the first direction.

An orthographic projection of a light-emitting region of the first sub-pixel unit on the first base substrate overlaps with an orthographic projection of the plurality of signal wires on the first base substrate. In some embodiments, the orthographic projection of the light-emitting region of the first sub-pixel unit on the first base substrate is within the orthographic projection of the plurality of signal wires on the first base substrate.

In the display substrate of the present disclosure, the first sub-pixel unit has no effect on the transparency of the OLED display substrate, and the transparency of the OLED display substrate is in the range of from 30% to 45%. The present disclosure thus makes it possible to improve the brightness of a display panel without modifying or altering the transparency of the display panel.

FIG. 3 shows a schematic diagram of a cross-sectional of an OLED display substrate according to an embodiment of the present disclosure.

As shown in FIG. 3, the display substrate comprises the first base substrate 101 and the first electrode layer 102 on the first base substrate 101. The display substrate further comprises a light-emitting layer 103 on the first electrode layer 102, and a second electrode layer 104 on the light-emitting layer 103.

The first electrode layer 102 may comprise a plurality of first sub-electrodes 102a. Each of the plurality of first sub-electrodes 102a positionally corresponds to one of the at least two sub-pixel units. The light-emitting layer 103 may comprise a plurality of light-emitting patterns 103a. Each of the plurality of light-emitting patterns 103a positionally corresponds to one of the at least two sub-pixel units. Each of the plurality of first sub-electrodes 102a is electrically coupled to a corresponding one of the plurality of light-emitting patterns 103a.

The second electrode layer 104 may be a continuous planar electrode, or may be configured to comprise a plurality of block electrodes (for example, in a similar manner as the first sub-electrodes 102a of the first electrode layer). Each of the light emitting patterns 103a is electrically coupled to the second electrode layer 104. In some embodiments, the display substrate further comprises a first auxiliary electrode layer on the second electrode layer 104. The first auxiliary electrode layer is electrically coupled to the second electrode layer 104.

The above descriptions illustrate the display substrate of the present disclosure primarily from the perspective of the first base substrate 101. It is however understood that the structure and configuration of the display substrate of the present disclosure may also be described from the perspective of the sub-pixel units. That is, for a given sub-pixel unit, the first sub-electrode 102*a* corresponding in position to that sub-pixel unit, the light-emitting pattern 103*a* electrically coupled to the first sub-electrode 102*a*, and the second electrode layer 104 on the light-emitting pattern 103*a*, constitute the light emitting unit of that particular sub-pixel unit. In other words, each of the sub-pixel units in a pixel unit 101*a* comprises a light-emitting unit, as described above, and a pixel drive circuit 105. The pixel drive circuit 105 is electrically coupled to the sub-pixel unit's first sub-electrode 102*a*, and is configured to supply a voltage to the first sub-electrode 102*a* to drive the first sub-electrode 102*a* to drive the light emitting pattern 103*a* to emit light.

In some embodiments, the display substrate further comprises a first black matrix on the second electrode layer 104. An orthographic projection of the first black matrix on the first base substrate 101 is within an orthographic projection of the pixel define layer 108.

In some embodiments, the display substrate further comprises a first color filter layer on a side of the first black matrix opposite from the first base substrate 101. The first color filter layer is arranged to positionally correspond to any one of the at least two sub-pixel other than the first sub-pixel unit and to the transparent area TA.

In at least some embodiments, the first electrode layer 102 comprises a reflective electrode layer. Light emitted from the light emitting patterns 103*a* can be reflected by the first electrode layer 102, and emitted through the second electrode layer 104. The first electrode layer 102 does not overlap with the transparent area TA. That is, the transparent area TA is not covered by the first electrode layer 102.

Figure 4:
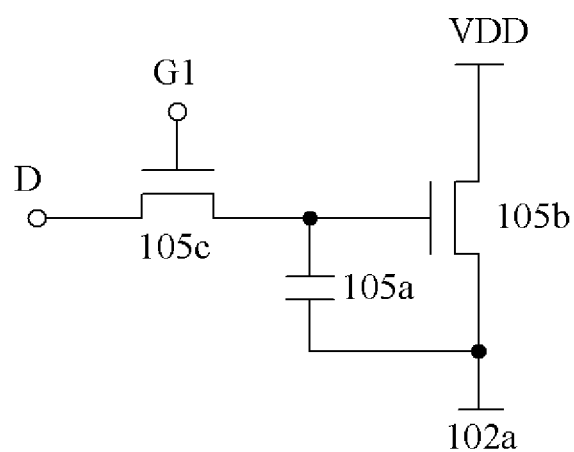
FIG. 4 shows a circuit diagram for a pixel drive circuit according to an embodiment of the present disclosure.

FIG. 4 shows a circuit diagram for a pixel drive circuit according to an embodiment of the present disclosure.

The pixel drive circuit 105 comprises a capacitor 105*a*, a first thin film transistor 105*b*, and a second thin film transistor 105*c*. The present disclosure does not particularly limit the first thin film transistor 105*b* and the second thin film transistor 105*c*, which may have any appropriate construction and configuration known to a person of ordinary skill in the art depending on the specific implementation of the display substrate. For example, the first and second thin film transistors 105*b*, 105*c* may each comprise a gate electrode, a first electrode (either a source electrode, or a drain electrode), and a second electrode (either a drain electrode if the first electrode is a source electrode, or a source electrode if the first electrode is a drain electrode). Further, it is understood that the pixel drive circuit 105 according to the present disclosure may include any appropriate accessories and/or components known to a person of ordinary skill in the art, for example, depending on the specific implementation of the pixel drive circuit, without departing from the scope and spirit of the present disclosure.

The capacitor 105*a* may comprise a first capacitor layer and a second capacitor layer. In some embodiments, a dielectric layer is provided between the first capacitor layer and the second capacitor layer. The first capacitor layer is electrically coupled to the gate electrode of the first thin film transistor 105*b* and the first electrode of the second thin film transistor 105*c*. The second capacitor layer is electrically coupled to the first electrode of the first thin film transistor 105*b* and a corresponding one of the plurality of electrode 102*a*. The gate electrode of first thin film transistor 105*b* is electrically coupled to the first electrode of the second thin film transistor 105*c*. In some embodiments, the second capacitor layer may be provided in the same layer as the active layer of the first thin film transistor 105*b*. That is, during fabrication, the second capacitor layer and the active layer of the first thin film transistor 105*b* may be formed in the same patterning step.

Each pixel drive circuit 105 is electrically coupled to at least one signal wire. The OLED display substrate according to the present disclosure may be provided with any appropriate signal wires known to a person of ordinary skill in the art. For example, the OLED display substrate may comprise a plurality of signal wires that include one or more of earth lines, clock lines for transmitting clock signals, ADD lines for transmitting ADD signals (i.e., auxiliary data signals), VDD lines for transmitting VDD signals (i.e., digital power signals), VSS lines for transmitting VSS signals (i.e., digital ground signals), and the like. In some embodiments, the gate electrode of the second thin film transistor 105*c* may be electrically coupled to the output terminal of a gate scan line G1, for example, as shown in FIG. 4. The second electrode of the second thin film transistor 105*c* may be electrically coupled to the output terminal of a data input line D, for example, as shown in FIG. 4. The first electrode of the first thin film transistor 105*b* may be electrically coupled to the output terminal of a VDD line, for example, as shown in FIG. 4.

The first electrode layer 102 comprises a plurality of first sub-electrodes 102*a*. Each of the plurality of first sub-electrodes 102*a* corresponds in position to one of the sub-pixel units. Further, each of the plurality of pixel drive circuits 105 is electrically coupled to one of the plurality of first sub-electrodes 102*a*. The pixel drive circuits 105 electrically coupled to the first sub-electrodes 102*a* of sub-pixel units other than the first sub-pixel unit are arranged to positionally correspond to the sub-pixel units themselves. In some embodiments, the display substrate comprises a first sub-pixel unit that is configured to emit white light. This makes it possible to increase the brightness of the display substrate. The location of the first sub-pixel unit may coincide with the signal wires of the display substrate. To prevent interferences from the signal wires, in the display substrate of present disclosure, the pixel drive circuit 105 electrically coupled to the first sub-electrode of the first sub-pixel unit is arranged partially in the sub-pixel unit nearest to the first sub-pixel unit. More particularly, the orthographic projection on the first base substrate of the pixel drive circuit electrically coupled to the first sub-electrode of the first sub-pixel partially overlaps with the orthographic projection on the first base substrate of the first sub-electrode of the nearest sub-pixel unit. In some embodiments, the pixel drive circuit 105 may therefore be provided outside the first sub-pixel unit.

The display substrate further comprises a plurality of signal wires extending in a second direction. The second direction is oriented to intersect the first direction. As described above, the first sub-pixel unit is arranged between the transparent areas TA of adjacent pixel units in the first direction. An orthographic projection of a light-emitting region of the first sub-pixel unit on the first base substrate overlaps with an orthographic projection of the plurality of signal wires on the first base substrate. In some embodiments, the orthographic projection of the light-emitting region of the first sub-pixel unit on the first base substrate is within the orthographic projection of the plurality of signal wires on the first base substrate. In a pixel unit in a display substrate according to the present disclosure, the transparent area TA occupies about 40-60% of the surface area of the pixel unit, and each of the sub-pixel units is dimensioned to occupy substantially the same amount of the surface area of the pixel unit. The configurations of the display substrate of the present disclosure thus make it possible to significantly increase the brightness of a display panel incorporating the display substrate.

Figure 5:
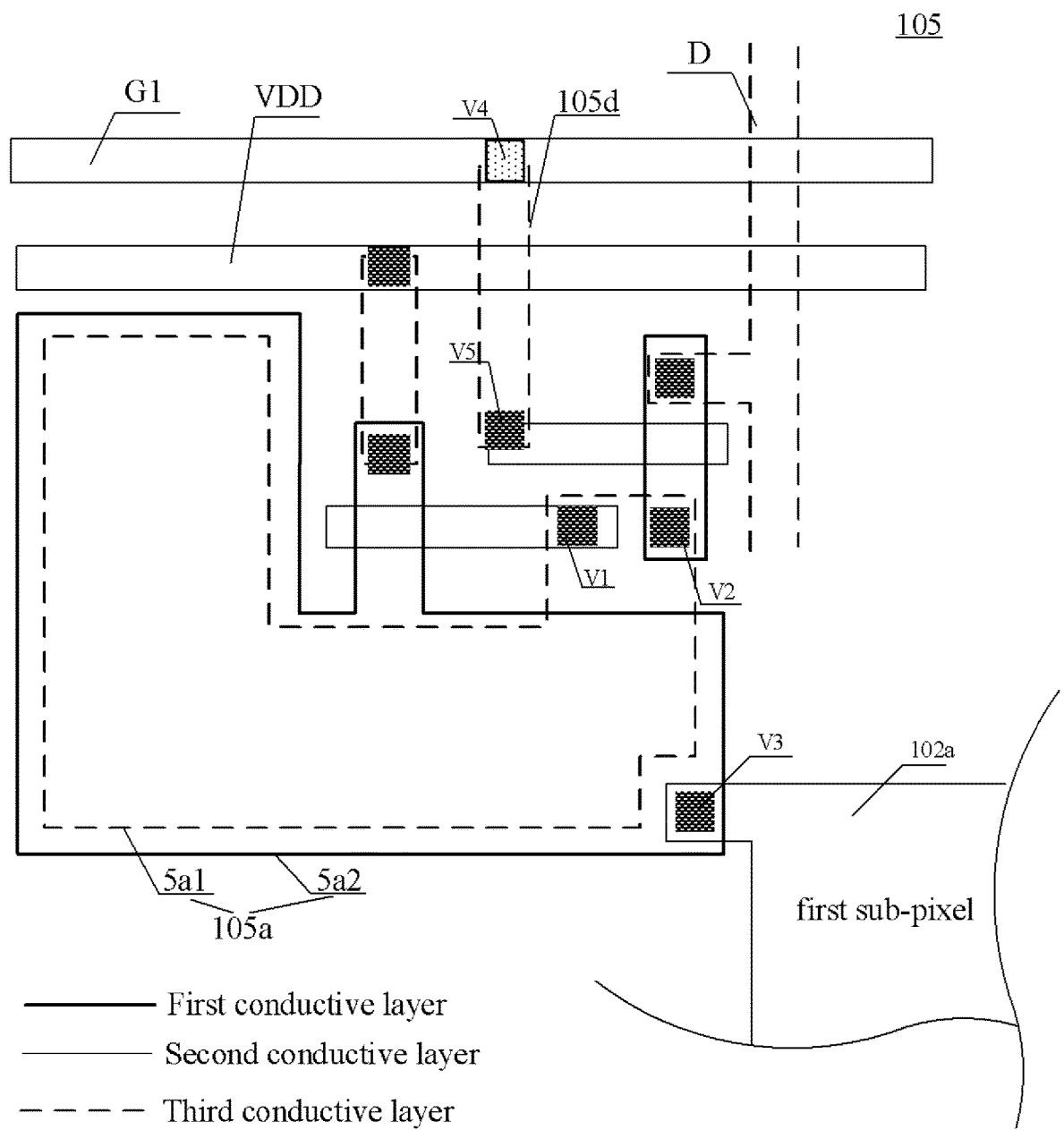
FIG. 5 shows a schematic diagram of a top view of a pixel drive circuit corresponding to a sub-electrode in an OLED display substrate according to an embodiment of the present disclosure.

FIG. 5 shows a schematic diagram of a top view of a pixel drive circuit of a sub-pixel unit of an OLED display substrate according to an embodiment of the present disclosure.

In the pixel drive circuit 105, the active layer of the first thin film transistor 105b, the active layer of the second thin film transistor 105c, and the second capacitor layer 5a2 of the capacitor 105a are provided in the same layer, and may be collectively referred to as the first conductive pattern (shown with bold solid line in FIG. 5). The pixel drive circuit 105 is also electrically coupled to certain signal lines, including the gate scan line G1 and the VDD line. The gate scan line G1, the gate electrode of the first thin film transistor 105b, and the gate electrode of the second thin film transistor 105c are provided in the same layer, and may be collectively referred to as the second conductive pattern (shown with thin solid line in FIG. 5). The first and second electrodes of the first thin film transistor 105b, the first and second electrodes of the second thin film transistor 105c, and the first capacitor layer 5a1 of the capacitor 105a are provided in the same layer, and may be collectively referred as the third conductive pattern (shown with thin dotted line in FIG. 5).

The first capacitor layer 5a1 may be electrically coupled to the gate electrode of the first thin film transistor 105b via the first via hole V1. The first capacitor layer 5a1 may be electrically coupled to the first electrode of the second thin film transistor 105c via the second via hole V2. The second capacitor layer 5a2 may be electrically coupled to the first sub-electrode 102a in the first sub-pixel unit via the third via hole V3 (shown with bold dotted line in FIG. 5). The first, second, and third via holes V1, V2, V3 are configured to connect two conductive patterns located in different layers. In some embodiments, the first, second, and third via holes V1, V2, V3 are located at the end of a conductive pattern. In some embodiments, the first, second, and third via holes V1, V2, V3 are configured as square prisms, and the opening area of each of the via holes is 4 μm×4 μm, 6 μm×6 μm, or 8 μm×8 μm.

The gate electrode of the first thin film transistor 105b may be electrically coupled to the first electrode of the second thin film transistor 105c via the first capacitor layer 5a1.

The gate electrode of the second thin film transistor 105c may be electrically coupled to the gate scan line G1 via the coupling line 105d provided in the same layer as the first capacitor layer 5a1. For example, in some embodiments, one end of the coupling line 105d may be electrically coupled to the gate scan line G1 via the fourth via hole V4, and the other end of the coupling line 105d may be electrically coupled to the gate electrode of the second thin film transistor 105c via the fifth via hole V5. The fourth and fifth via holes V4, V5 may be configured similarly as the first, second, or third via holes V1, V2, V3 described above.

The second electrode of the second thin film transistor 105c may be provided in the same layer as the data input line D. In some embodiments, the second electrode of the second thin film transistor 105c may be directly coupled to the data input line D.

The second electrode of the first thin film transistor 105b may be electrically coupled to the VDD line via the sixth via hole V6. The sixth via hole V6 may be configured similarly as the first, second, or third via holes V1, V2, V3 described above.

It is understood that the first capacitor layer 5a1 of the pixel drive circuit 105 may be arranged and/or configured in any appropriate manner known to a person of ordinary skill in the art. The present disclosure does not particularly limit the arrangement or configuration of the first capacitor layer 5a1. Three illustrative, non-limiting embodiments are described below.

In some embodiments, for example, as shown in FIGS. 3 and 5, the first capacitor layer 5a1 may be provided in the same layer as the first electrode of the first thin film transistor 105b.

In some embodiments, the first capacitor layer 5a1 may be provided in the same layer as the first electrode layer 102.

Figure 6:
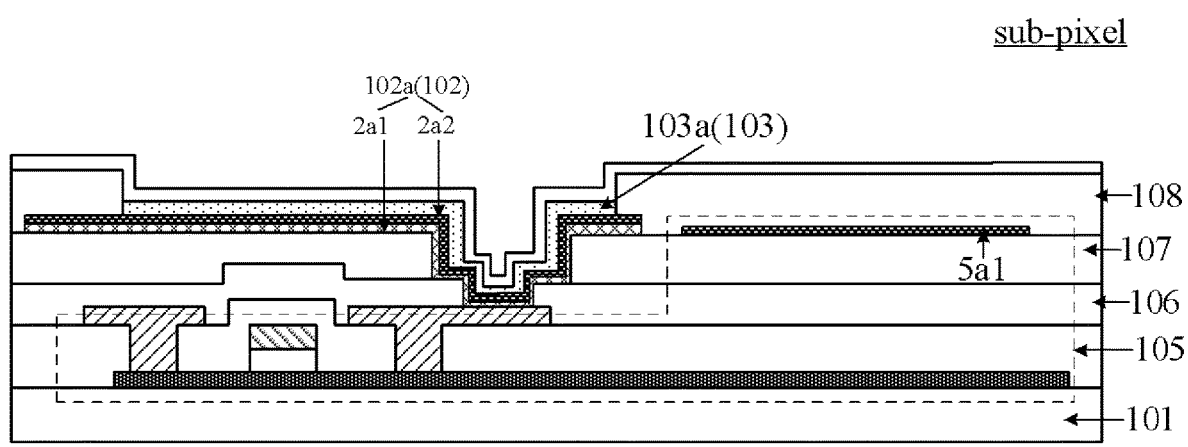
FIG. 6 shows a schematic diagram of a cross-sectional of an OLED display substrate according to another embodiment of the present disclosure.

In some embodiments, the first capacitor layer 5a1 may be configured in the manner illustrated in FIG. 6. FIG. 6 shows a schematic diagram of a cross-sectional of an OLED display substrate according to another embodiment of the present disclosure. As shown in FIG. 6, in some embodiments, the first electrode layer 102 may comprise a reflective electrode layer 2a1 and a transparent electrode layer 2a2 arranged in this order on the first base substrate 101. More particularly, the reflective electrode layer 2a1 and the transparent electrode layer 2a2 are arranged in this order in a direction away from the first base substrate 101. Each of the plurality of first sub-electrodes 102a of the first electrode layer 102 may comprise a reflective sub-electrode 2a1 and a transparent sub-electrode 2a2.

In some embodiments, in each pixel drive circuit 105, the first capacitor layer 5a1 may be provided in the same layer as the transparent electrode layer 2a2. In these embodiments, the first capacitor layer 5a1 is composed only of the material forming the transparent electrode layer 2a2, and does not contain any of the material forming the reflective electrode layer 2a1. The second capacitor layer 5a2 provided in the same layer as the active layer of the first thin film transistor 105b may also be composed of a transparent material. As such, when the first capacitor layer 5a1 is composed of a transparent material, the transparency of the resulting capacitor 105a in the pixel drive circuit 105 can increase the transparency of the final OLED display substrate.

In some embodiments, in a pixel unit, the at least sub-pixel units may be arranged in a row in the same direction as the length or longitudinal direction of the transparent area TA, for example, as shown in FIG. 1 (the length direction of the transparent area TA being designated as "x" in FIG. 1).

The at least two sub-pixel units may comprise a white sub-pixel unit. In some embodiments, the length of longitudinal direction of the first sub-pixel unit may be parallel to the width or transverse direction of the transparent area TA, for example, as shown in FIG. 1 (the width direction of the transparent area TA being designated as "y" in FIG. 1).

The sub-pixel units that are not the white sub-pixel unit may be selected from the group consisting of a red sub-pixel unit, a green sub-pixel unit, and a blue sub-pixel unit.

As shown in FIGS. 3 and 6, an OLED display substrate according to the present disclosure may further comprise a passivation layer 106, a flattening layer 107, and a pixel define layer 108 on the first base substrate 101. It is understood that the passivation layer, flattening layer, and pixel define layer may be configured and formed in any appropriate manner known to a person of ordinary skill in the art depend on need, and the present disclosure is not particularly limited in these regards.

As described above, in an OLED display substrate according to the present disclosure, one of the sub-pixel units in a pixel unit may be located between transparent areas of sub-pixel units of adjacent pixel units. This location may coincide with the signal wires on the display substrate. In conventional technologies, the signal wires are usually covered with black matrix to prevent interferences between the signal wires and the pixel drive circuit coupled to the nearby sub-pixel unit. In contrast, in the present disclosure, the sub-pixel unit is not covered with a black matrix. Since light is allowed to emit through the sub-pixel unit, the OLED display substrate according to the present disclosure thus makes it possible to increase the brightness of a display panel incorporating the display substrate.

Figure 7:
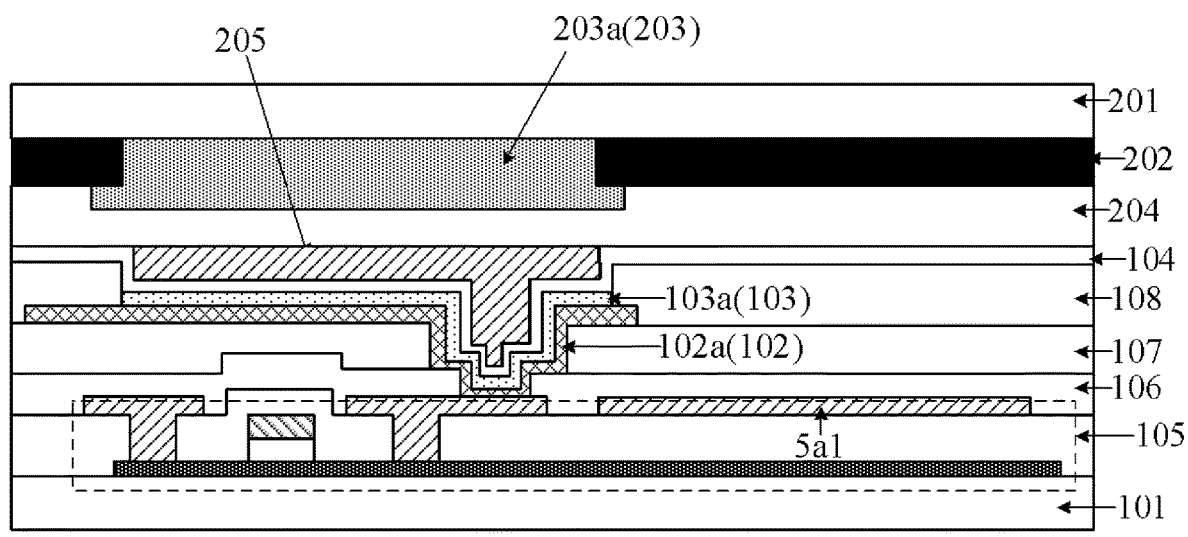
FIG. 7 shows a schematic diagram of a display panel according to an embodiment of the present disclosure.

The present disclosure also provides a display panel. FIG. 7 shows a schematic diagram of a display panel according to an embodiment of the present disclosure.

As shown in FIG. 7, the display panel may comprise a front plate 20 and a back plate. The back plate may comprise an OLED display substrate according to the present disclosure, for example, as shown in FIGS. 1, 2, 3, and/or 6.

Figure 8:
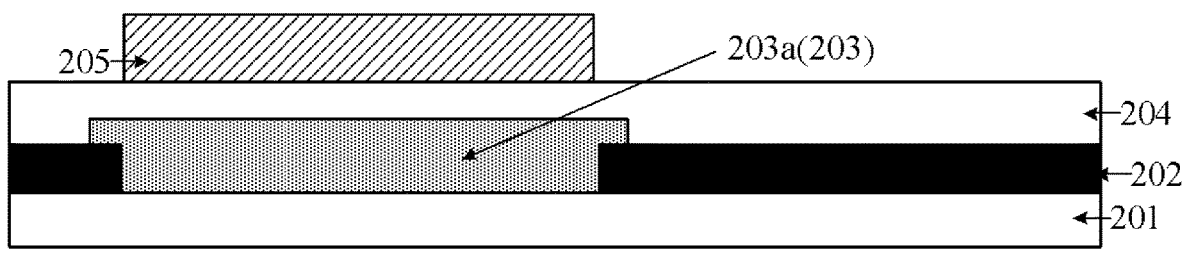
FIG. 8 shows a schematic diagram of a front plate for a display panel according to an embodiment of the present disclosure.

FIG. 8 shows a schematic diagram of a front plate for a display panel according to an embodiment of the present disclosure.

As shown in FIG. 8, the front plate may comprise a second base substrate 201 and a second black matrix 202 on the second base substrate 201. In the assembled display panel, the orthographic projection of the second black matrix 202 on the first base substrate 101 does not overlap with the orthographic projection of the first sub-pixel unit on the first base substrate 101.

In some embodiments, the orthographic projection of the second black matrix 202 on the first base substrate 101 overlaps with the orthographic projections of all portions of the OLED display substrate on the first base substrate 101 outside of the transparent area TA and the sub-pixel units including the first sub-pixel unit. Put differently, the orthographic projection of the second black matrix 202 on the first base substrate 101 does not overlap with the orthographic projections on the first base substrate 101 of the transparent area TA or the sub-pixel units including the first sub-pixel unit.

In some embodiments, the front plate 202 may further comprise a second color filter layer 203 on a side of the second black matrix 202 opposite from the second base substrate 201, for example, as shown in FIG. 8.

The second color filter layer is arranged to positionally correspond to any one of the at least two sub-pixel units other than the first sub-pixel unit and to the transparent area. More particularly, the second color filter layer 203 may comprise a plurality of color filters 203a, each of the plurality color filters 203a corresponding in position to one of the sub-pixel units other than the first sub-pixel unit. In some embodiments, the second color filter layer 203 may comprise a plurality of color filters 203a selected from the group consisting of a red color filter, a green color filter, and a blue color filter.

In some embodiments, an insulation layer 204 and a second auxiliary electrode layer 205 are provided on a side of the second color filter layer 203 opposite from the second base substrate 201, for example, as shown in FIG. 7. The second auxiliary electrode layer 205 is configured to be electrically coupled to the second electrode layer 104 of the OLED display substrate in the back plate. The second auxiliary electrode layer 205 may be composed of a metallic material. The second electrode layer 104 is an electrode layer having transparency, and the second electrode layer 104 may be composed of any suitable transparent material known to a person of ordinary skill in the art, including indium tin oxide, indium-doped zinc oxide, and the like. The resistance of an electrode layer having transparency tends to be larger, while the resistance of a metallic material tends to be smaller. By electrically coupling the second auxiliary electrode layer 205 and the second electrode layer 104, the present disclosure makes it possible to reduce the resistance in the second electrode layer 104.

The present disclosure also provides a method of fabricating an OLED display substrate. The OLED display substrate may be as described above.

In some embodiments, for example, to form the OLED display substrate illustrated in FIG. 1, the method may comprise forming a first base substrate comprising a plurality of pixel units arranged in an array, at least one of the plurality of pixel units comprising at least two sub-pixel units and a transparent area; forming a first electrode layer on the first base substrate, the first electrode layer comprising a plurality of first sub-electrodes, each of the plurality of first sub-electrodes positionally corresponding to one of the at least two sub-pixel units; forming a pixel define layer on the first electrode layer, the pixel define layer comprising a plurality of openings, each of the plurality of openings positionally corresponding to a light-emitting region of one of the at least two sub-pixel units and to the transparent area; and forming a plurality of pixel drive circuits, each of the plurality of pixel drive circuits being electrically coupled to a corresponding one of the plurality of first sub-electrodes. The at least two sub-pixel units comprise a first sub-pixel unit, the first sub-pixel unit being arranged between transparent areas of adjacent pixel units in a first direction. An orthographic projection of a pixel drive circuit electrically coupled to the first sub-electrode corresponding to the first sub-pixel unit on the first base substrate partially overlaps with an orthographic projection of a first sub-electrode positionally corresponding to another one of the at least two sub-pixel units on the first base substrate.

Figure 9:
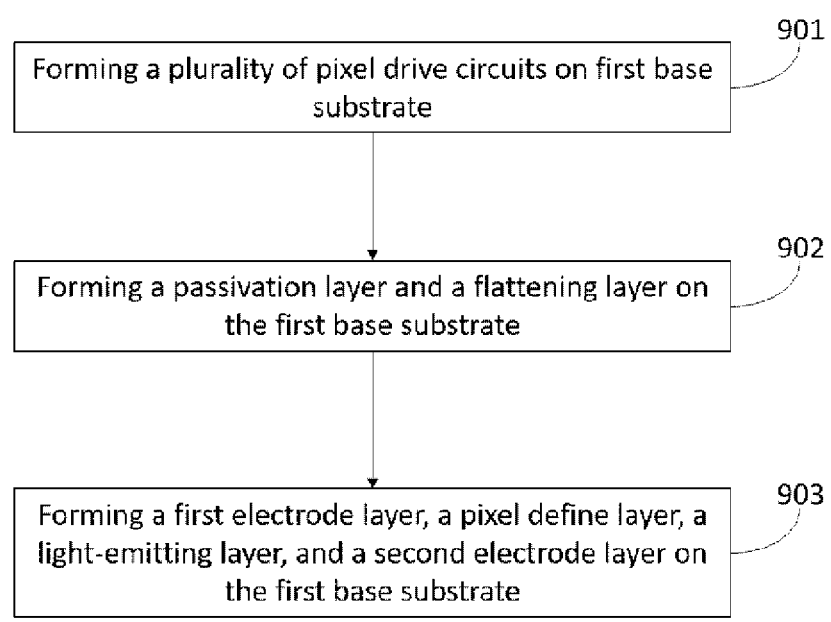
FIG. 9 shows a flow chart for a method of fabricating an OLED display substrate according to an embodiment of the present disclosure.

FIG. 9 shows a flow chart for a method of fabricating an OLED display substrate according to an embodiment of the present disclosure. The OLED display substrate illustrated in FIGS. 2 and 3 may be fabricated as shown in FIG. 9.

In step 901, a plurality of pixel drive circuits are formed on the first base substrate.

Each of the plurality of pixel drive circuits comprises a capacitor, a first thin film transistor, and a second thin film transistor. The structure and configuration of each pixel drive circuit may be as described above, and the corresponding descriptions are not repeated here.

More particularly, a first conductive pattern forming film is formed on the first base substrate by any suitable means known to a person of ordinary skill in the art, including, but not limited to, deposition, coating, sputtering, and the like. A single patterning step is then performed using a single mask on the first conductive pattern forming film to form the first conductive pattern.

The first conductive pattern may comprise the active layer of the first thin film transistor, the active layer of the second thin film transistor, and the second capacitor layer of the capacitor.

A first gate insulation layer forming film and a second conductive layer forming film are formed in turn on the first base substrate, on which the first conductive pattern has been formed. The first gate insulation layer forming film and the second conductive pattern forming film may be formed by any suitable means known to a person of ordinary skill in the art, including, but not limited to, deposition, coating, sputtering, and the like. A single patterning step is then performed using a single mask on the first gate insulation layer forming film and the second conductive pattern forming film to form the gate insulation layer and the second conductive pattern, respectively.

The second conductive pattern may comprise the gate electrode of the first thin film transistor, and the gate electrode of the second thin film transistor. After forming the gate insulation layer and the second conductive layer, the first conductive layer may be subject to treatment that imparts conductivity to portions of the first conductive layer outside the orthographic projections of the gate electrodes of the first and second thin film transistors on the first conductive pattern.

A dielectric layer forming film is formed on the first base substrate, on which the second conductive pattern has been formed. The dielectric layer forming film may be formed by any suitable means known to a person of ordinary skill in the art, including, but not limited to, deposition, coating, sputtering, and the like. A single patterning step is then performed using a single mask on the dielectric layer forming film to form the dielectric layer.

A third conductive pattern forming film is formed on the first base substrate, on which the dielectric layer has been formed. The third conductive pattern forming film may be formed by any suitable means known to a person of ordinary skill in the art, including, but not limited to, deposition, coating, sputtering, and the like. A single patterning step is then performed using a single mask on the third conductive pattern forming film to form the third conductive layer. The third conductive pattern may comprise the first and second electrodes of the first thin film transistor, the first and second electrodes of the second thin film transistor, and the first capacitor layer.

It is understood that even though the above descriptions relate to a top gate-type first and second thin film transistors, the first and second thin film transistors may also be bottom gate-type.

Each of the patterning steps described above may be any suitable patterning process known to a person of ordinary skill in the art, and is not particularly limited. For example, the first patterning step may comprise photoresist coating, exposure, development, etching, and photoresist stripping.

In step 902, a passivation layer and a flattening layer are formed on the first base substrate, on which the plurality of pixel drive circuits have been formed.

The passivation layer may be composed of any suitable material known to a person of ordinary skill in the art, including, but not limited to, silicon dioxide ($SiO_2$), silicon nitride ($Si_3N_4$), silicon-oxy-nitride ($SiO_xN_y$), and the like.

The flattening layer may be composed of any suitable material known to a person of ordinary skill in the art, including, but not limited to, acrylic resin, epoxy, and the like.

More particularly, a passivation layer forming film and a flattening layer forming film may be formed on the first base substrate by any suitable means known to a person of ordinary skill in the art, including, but not limited to, deposition, coating, sputtering, and the like. A single patterning step is then performed using a single mask on the passivation layer forming film and the flattening layer forming film to form the passivation layer and the flattening layer, respectively. The patterning step may be any suitable patterning process known to a person of ordinary skill in the art, and is not particularly limited. For example, the first patterning step may comprise photoresist coating, exposure, development, etching, and photoresist stripping.

In step 903, the first electrode layer, the pixel define layer, the light-emitting layer, and the second electrode layer are formed on the first base substrate, on which the flattening layer has been formed.

A first electrode layer forming film is formed on the first base substrate by any suitable means known to a person of ordinary skill in the art, including, but not limited to, deposition, coating, sputtering, and the like. The first electrode layer forming film comprises a reflective electrode layer and a transparent electrode layer arranged in a stack. The reflective electrode layer may be composed of a metallic material, which may be any suitable metallic material known to a person of ordinary skill in the art. For example, the reflective electrode layer may be composed of Ag, Cu, Al, Mo, and the like. In some embodiments, the reflective electrode layer may comprise a plurality of metal layers, for example, MoNb/Cu/MoNb and the like. In some embodiments, the reflective electrode layer may be composed of an alloy, including AlNd, MoNb, and the like. The transparent electrode layer may be composed of any suitable transparent material known to a person of ordinary skill in the art, including, but not limited to, indium tin oxide (ITO).

A single patterning step is then performed using a single mask on the first electrode layer forming film to form the first electrode layer. The first electrode layer comprises a plurality of first sub-electrodes.

A pixel define layer forming film is formed on the first base substrate by any suitable means known to a person of ordinary skill in the art, including, but not limited to, deposition, coating, sputtering, and the like. The pixel define layer may be composed of an organic material, including polyimide, poly(methyl methacrylate) (PMMA), polydimethylsiloxane, and the like.

A single patterning step is then performed using a single mask on the pixel define layer forming film to form the pixel define layer.

The light-emitting layer is formed on the first base substrate, on which the pixel define layer has been formed, by an inkjet printing process.

The second electrode layer is formed on the first base substrate, on which the light-emitting layer has been formed, by any suitable means known to a person of ordinary skill in the art, including, but not limited to, deposition, coating, sputtering, and the like. The second electrode layer may be composed of materials such as indium zinc oxide and the like. In some embodiments, the second electrode layer is a continuous layer.

Each of the patterning steps described above may be any suitable patterning process known to a person of ordinary skill in the art, and is not particularly limited. For example, the first patterning step may comprise photoresist coating, exposure, development, etching, and photoresist stripping.

Steps 901 to 903 may be performed to obtain the OLED display substrate illustrated in FIG. 3. To form the OLED display substrate illustrated in FIG. 6, it is not necessary to form the first capacitor layer when forming the third conductive pattern in step 901. Instead, the first capacitor layer is formed in step 903 when forming the first electrode layer. More particularly, two patterning steps are performed to form the first electrode layer and the first capacitor layer. Performing two patterning steps allows the first capacitor layer to be formed of materials such as indium tin oxide, which can ensure the transparency of the capacitor in the pixel drive circuit.

A person of ordinary skill in the art would readily appreciate that the principles and embodiments of the OLED display substrate described above apply to the OLED display substrate fabricated according to the present disclosure. For convenience and clarity, the details of the OLED display substrate of the present disclosure are not repeated here.

In an OLED display substrate according to the present disclosure, one of the sub-pixel units in a pixel unit may be located between transparent areas of sub-pixel units of adjacent pixel units. This location may coincide with the signal wires on the display substrate. In conventional technologies, the signal wires are usually covered with black matrix and the pixel drive circuit coupled to the nearby sub-pixel unit. In contrast, in the present disclosure light is allowed to emit through the sub-pixel unit arranged on the signal wires, the OLED display substrate according to the present disclosure thus makes it possible to increase the brightness of a display panel incorporating the display substrate.

The present disclosure also provides a display device. The display device may comprise a display panel as described above. A display panel according to the present disclosure may be integrated into any device configured to provide a display function, including, but not limited to, an electronic paper, a mobile phone, a tablet, a television, a computer, a display, a notebook computer, a digital photo frame, a navigation system, and any other products or components that provide a display function.

When required to exhibit the same or similar level of brightness as a conventional transparent display device, the display device according to the present disclosure is able to achieve that brightness without having to supply a higher voltage to the light-emitting layer in the display device. This is because the brightness of the display device according to the present disclosure is already higher than is possible with conventional display devices. As such, the light-emitting layer of the display device according to the present disclosure can enjoy a longer lifespan, which can in turn increase the useful life of the display device.

Further, since the display device according to the present disclosure may incorporate white sub-pixel units, it is necessary to activate only the white sub-pixel units in order to produce black-and-white displays. It is not necessary to activate other color sub-pixel units for a black-and-white display. This makes it possible to reduce the display device's power consumption.

References in the present disclosure made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept.

Unless otherwise defined, all the technical and scientific terms used herein have the same meanings as commonly understood by one of ordinary skill in the art to which the present invention belongs. Terms such as "first," "second," and so on, are not intended to indicate any sequence, amount or importance, but distinguish various components. Terms such as "comprises," "comprising," "includes," "including," and so on, are intended to specify that the elements or the objects stated before these terms encompass the elements or the objects and equivalents thereof listed after these terms, but do not preclude the other elements or objects. Phrases such as "connect", "connected", and the like, are not intended to define a physical connection or mechanical connection, but may include an electrical connection, directly or indirectly. Terms such as "on," "under," "right," "left" and the like are only used to indicate relative position relationship, and when the position of the object which is described is changed, the relative position relationship may be changed accordingly.

The principle and the embodiment of the present disclosures are set forth in the specification. The description of the embodiments of the present disclosure is only used to help understand the embodiments of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display substrate, comprising:
a first base substrate comprising a plurality of pixel units arranged in an array, each of the plurality of pixel units comprising at least two sub-pixel units and a transparent area,
a first electrode layer on the first base substrate comprising a plurality of first sub-electrodes, each of the plurality of first sub-electrodes positionally corresponding to one of the at least two sub-pixel units;
a pixel define layer on the first electrode layer, the pixel define layer comprising a plurality of openings, each of the plurality of openings positionally corresponding to a light-emitting region of one of the at least two sub-pixel units and to the transparent area; and
a plurality of pixel drive circuits, each of the plurality of pixel drive circuits being electrically coupled to a corresponding one of the plurality of first sub-electrodes;
wherein:
the at least two sub-pixel units comprise a first sub-pixel unit, the first sub-pixel unit being arranged between transparent areas of adjacent pixel units in a first direction;
the first sub-pixel unit is a white sub-pixel unit configured to emit a white light;
the at least two sub-pixel units includes at least one color sub-pixel unit, the first sub-pixel unit is arranged between color sub-pixel units of adjacent pixel units in a first direction, and the at least one color sub-pixel unit is arranged between transparent areas of adjacent pixel units in a second direction;

a length of the first sub-pixel unit is greater than a length of the at least one color sub-pixel along the second direction;

an orthographic projection of a pixel drive circuit electrically coupled to the first sub-electrode corresponding to the first sub-pixel unit on the first base substrate partially overlaps with an orthographic projection of a first sub-electrode positionally corresponding to the at least one color sub-pixel unit nearest to the first sub-pixel unit; and the display substrate further includes a plurality of signal wires extending in a second direction, the plurality of signal wires on the first base substrate are disposed under an area of a light-emitting region of the first sub-pixel unit, and the second direction intersects with the first direction.

2. The display substrate according to claim 1, wherein the first sub-pixel unit has a rectangular shape, and a ratio of a length of the first sub-pixel unit to a width of the first sub-pixel unit is from 9:1 to 5:1.

3. The display substrate according to claim 1, further comprising a light-emitting layer on the first electrode layer, and a second electrode layer on the light-emitting layer.

4. The display substrate according to claim 3, further comprising a first auxiliary electrode layer on the second electrode layer,
wherein the first auxiliary electrode layer is electrically coupled to the second electrode layer.

5. The display substrate according to claim 3, further comprising a first black matrix on the second electrode layer,
wherein an orthographic projection of the first black matrix on the first base substrate is within an orthographic projection of the pixel define layer.

6. The display substrate according to claim 5, further comprising a first color filter layer on a side of the first black matrix opposite from the first base substrate,
wherein the first color filter layer is arranged to positionally correspond to any one of the at least two sub-pixel units other than the first sub-pixel unit and to the transparent area.

7. The display substrate according to claim 1, wherein:
each pixel drive circuit comprises a capacitor, a first thin film transistor, and a second thin film transistor,
the capacitor comprises a first capacitor layer and a second capacitor layer,
the first thin film transistor comprises a first active layer, a first gate electrode, a first source electrode, and a first drain electrode,
the second thin film transistor comprises a second active layer, a second gate electrode, a second source electrode, and a second drain electrode,
the first capacitor layer is electrically coupled to the first gate electrode, and one of the second source electrode and the second drain electrode, and
the second capacitor layer is electrically coupled to one of the first source electrode and the first drain electrode, and one of the plurality of electrode corresponding to the pixel drive circuit.

8. The display substrate according to claim 7, wherein the second capacitor layer is provided in a same layer as the first active layer, and the second capacitor layer and the first active layer are formed by a same material.

9. The display substrate according to claim 7, wherein the first capacitor layer is provided in a same layer as the first electrode layer, and the first capacitor layer and the first electrode layer are formed by a same material.

10. The display substrate according to claim 1, wherein the first electrode layer comprises a reflective electrode layer and a transparent electrode layer arranged in this order in a direction away from the first base substrate.

11. The display substrate according to claim 10, wherein the first capacitor layer is provided in a same layer as the transparent electrode layer.

12. The display substrate according to claim 1, wherein the first capacitor layer is provided in a same layer as one of the first source electrode and the first drain electrode.

13. A display device, comprising:
a display substrate according to claim 1, and
an opposite substrate comprising a second base substrate and a second black matrix on the second base substrate,
wherein an orthographic projection of the second black matrix on the first base substrate is within an orthographic projection of the pixel define layer on the first base substrate.

14. The display device according to claim 13, further comprising a second color filter layer on a side of the second black matrix opposite from the second base substrate,
wherein the second color filter layer is arranged to positionally correspond to any one of the at least two sub-pixel units other than the first sub-pixel unit and to the transparent area.

15. The display device according to claim 13, further comprising a second auxiliary electrode layer on a side of the second color filter layer opposite from the second base substrate,
the second auxiliary electrode layer is configured to be electrically coupled to the second electrode layer,
the second auxiliary electrode layer is composed of a metal material, and
the second electrode layer is composed of a transparent material.

16. A method of fabricating a display substrate,
forming a first base substrate comprising a plurality of pixel units arranged in an array, at least one of the plurality of pixel units comprising at least two sub-pixel units and a transparent area,
forming a first electrode layer on the first base substrate, the first electrode layer comprising a plurality of first sub-electrodes, each of the plurality of first sub-electrodes positionally corresponding to one of the at least two sub-pixel units;
forming a pixel define layer on the first electrode layer, the pixel define layer comprising a plurality of openings, each of the plurality of openings positionally corresponding to a light-emitting region of one of the at least two sub-pixel units and to the transparent area; and
forming a plurality of pixel drive circuits, each of the plurality of pixel drive circuits being electrically coupled to a corresponding one of the plurality of first sub-electrodes;

wherein:
the at least two sub-pixel units comprise a first sub-pixel unit, the first sub-pixel unit being arranged between transparent areas of adjacent pixel units in a first direction;
the first sub-pixel unit is a white sub-pixel unit configured to emit a white light;
the at least two sub-pixel units includes at least one color sub-pixel unit, the first sub-pixel unit is arranged between color sub-pixel units of adjacent pixel units in a first direction, and the at least one color sub-pixel unit is arranged between transparent areas of adjacent pixel units in a second direction;

a length of the first sub-pixel unit is greater than a length of the at least one color sub-pixel along the second direction;

an orthographic projection of a pixel drive circuit electrically coupled to the first sub-electrode corresponding to the first sub-pixel unit on the first base substrate partially overlaps with an orthographic projection of a first sub-electrode positionally corresponding to the at least one color sub-pixel unit nearest to the first sub-pixel unit; and the display substrate further includes a plurality of signal wires extending in a second direction, the plurality of signal wires on the first base substrate are disposed under an area of a light-emitting region of the first sub-pixel unit, and the second direction intersects with the first direction.

* * * * *